United States Patent
Niwa et al.

(10) Patent No.: US 7,821,037 B2
(45) Date of Patent: Oct. 26, 2010

(54) HETEROJUNCTION BIPOLAR TRANSISTOR

(75) Inventors: Takaki Niwa, Kawasaki (JP); Naoto Kurosawa, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 301 days.

(21) Appl. No.: 11/941,100

(22) Filed: Nov. 16, 2007

(65) Prior Publication Data
US 2008/0116489 A1    May 22, 2008

(30) Foreign Application Priority Data
Nov. 16, 2006   (JP)   .............................. 2006-310076

(51) Int. Cl.
*H01L 31/0328* (2006.01)
(52) U.S. Cl. ............... 257/198; 257/591; 257/E29.189; 257/E29.185
(58) Field of Classification Search ................ 257/198, 257/591, E29.189, E29.185
See application file for complete search history.

(56) References Cited

U.S. PATENT DOCUMENTS 5,336,909 A * 8/1994 Katoh et al. ................ 257/197
7,038,250 B2 * 5/2006 Sugiyama et al. ........... 257/183
2003/0136956 A1 * 7/2003 Niwa et al. ................... 257/12
2007/0096150 A1 * 5/2007 Ikeda .......................... 257/197
2007/0145412 A1 * 6/2007 Murayama et al. .......... 257/183

FOREIGN PATENT DOCUMENTS

| JP | 2006-60221 | 3/2006 |
|---|---|---|
| JP | 2006-203036 | 8/2006 |

OTHER PUBLICATIONS

Iwamoto et al., "Linearity Characteristics of GaAs HBTs adn the Influence of Collector Design," IEEE Trans. on Micro. Theory and Techniques. vol. 48, No. 12, pp. 2377-2388 (Dec. 2000).

* cited by examiner

*Primary Examiner*—Tu-Tu V Ho
(74) *Attorney, Agent, or Firm*—Young & Thompson

(57) ABSTRACT

A heterojunction bipolar transistor includes a first conductivity type subcollector layer, a first collector layer containing a first conductivity type impurity, a third collector layer containing a higher concentration of the first conductivity type impurity than the first collector layer, a second collector layer containing a lower concentration of the first conductivity type impurity than the first collector layer, a second conductivity type base layer, a first conductivity type emitter layer containing a semiconductor with a wider bandgap than the base layer, and a first conductivity type emitter cap layer.

15 Claims, 12 Drawing Sheets

HETEROJUNCTION BIPOLAR TRANSISTOR

BACKGROUND OF THE INVENTION

1. Field of the Invention

The present invention relates to a heterojunction bipolar transistor and, particularly, to an epitaxial thin-film structure of a heterojunction bipolar transistor capable of improving ruggedness of the transistor in the event of excessive input and load change.

2. Description of Related Art

A power amplifier for mobile phones is required to have high ruggedness such that it does not fail when an output load impedance of the power amplifier changes upon excessive input. For example, it is required to have high ruggedness such that it does not fail even if an output is in the mismatch state (VSWR=15:1) in the event of excessive input at +8 to +13 dB. Further, in order to reduce the cost of mobile phones, a structure that eliminates an isolator, which has been placed between an antenna and a power amplifier, is used in increasing cases. Accordingly, the ruggedness becomes increasingly important.

A heterojunction bipolar transistor (HBT) is a bipolar transistor with a heterojunction structure in which an emitter bandgap is larger than a base bandgap in an emitter-base junction. A HBT is mainly used in a power amplifier for mobile devices (particularly, mobile phones). In order to improve the ruggedness of a HBT, techniques of increasing an on-state breakdown voltage, which is a breakdown voltage during operation, are disclosed as follows. For example, Masaya Iwamoto "IEEE Transactions on Microwave Theory and Techniques", Vol. 48, No. 12, December 2000, pp. 2383, Table 3 (which is referred to hereinafter as Iwamoto) discloses a structure that improves a collector-emitter breakdown voltage BVceo by increasing the thickness of a collector layer. FIG. 19 schematically shows an exemplary structure of a heterojunction bipolar transistor 71 using the technique taught by Iwamoto (a related art 1).

Japanese Unexamined Patent Application Publication No. 2006-060221 (Pan) discloses a collector structure that improves an on-state breakdown voltage by increasing the doping concentration of a collector layer gradually from a base layer side to a subcollector layer side. For example, the concentration of a collector layer composed of three layers increases gradually from a base layer side to a subcollector layer side. In this structure, if an electric field is applied to a collector, a depletion layer in the collector expands according to the electric field. Accordingly, a concentration of the electric field in the collector, and particularly on the subcollector side, is reduced to thereby suppress the occurrence of avalanche breakdown. With the impurity concentration and the collector layer thickness that are described in an embodiment taught by Pan, an on-state breakdown voltage (a collector-emitter breakdown voltage during operation) with a collector current density Jc of 0 to 20 kA/cm$^2$, which is an operating current range of a mobile phone power amplifier, is reduced (cf. "collector 1" in FIG. 5 of Pan). FIG. 20 schematically shows an exemplary structure of a heterojunction bipolar transistor 72 that partly adjusts the collector layer thickness and concentration to conform with a power amplifier for mobile phones while retaining the principle of operation that is disclosed in Pan (a related art 2).

Japanese Unexamined Patent Application Publication No. 2006-203036 (Tanpo) discloses a technique for providing a semiconductor device that enables to stabilize HBT characteristics while achieving finer design rules and significant reduction in number of manufacturing process by using simultaneously-formed electrodes of emitter, base and collector electrodes. The heterojunction bipolar transistor taught by Tanpo has a collector structure that includes a lamination of an n− type GaAs layer, an n+ type GaAs layer and an n− type GaAs layer. In this structure, the doping concentration of the collector layer gradually increases or decreases toward an upper and a lower semiconductor. The concentration gradient at the interface of each layer is thus reduced, thereby stabilizing the drifting of electrons.

However, the above related arts have the following problems. Specifically, the mere increase in collector layer thickness as seen in the structure taught by Iwamoto causes the Kirk effect to become significant. As a result, an electric field in the vicinity of the base layer of the collector layer is lowered particularly. This hinders the electrons that are injected from the base layer to the collector layer from flowing with sufficient acceleration, leading to a decrease in collector current. Therefore, a knee voltage increases, which results in the degradation of the efficiency of a power amplifier.

Further, in the technique of Pan, if an electric field is applied to a collector layer, a depletion layer within the collector layer expands according to the electric field to thereby prevent breakdown. Accordingly, the width of the depletion layer constantly changes largely according to a voltage applied to the collector layer, so that base-collector capacitance also changes significantly. This causes the degradation of AM/PM distortion (phase distortion), which degrades the distortion characteristics of a power amplifier.

SUMMARY

According to one aspect of the present invention, there is provided a heterojunction bipolar transistor that includes a subcollector layer of a first conductivity type, a first collector layer formed on the subcollector layer, the first collector layer containing an impurity of the first conductivity type, a third collector layer formed on the first collector layer, the third collector layer containing an impurity of the first conductivity type at a higher concentration than the first collector layer, a second collector layer formed on the third collector layer, the second collector layer containing an impurity of the first conductivity type at a lower concentration than the first collector layer, a base layer of a second conductivity type formed on the second collector layer, an emitter layer of the first conductivity type formed on the base layer, the emitter layer containing a semiconductor with a wider bandgap than the base layer, and an emitter cap layer of the first conductivity type formed on the emitter layer.

In this structure, only a part of the collector layer is activated during normal operation, so that an actual thickness of the collector layer can be reduced. A change in collector capacitance thereby decreases significantly, thus suppressing AM/PM distortion. Further, an electric field within the collector layer thereby becomes higher, thus improving the leading edge characteristics in the current-voltage characteristics. On the other hand, the entire collector layer is activated during excessive input operation. An on-state breakdown voltage thereby increases. It is thereby possible to improve the distortion characteristics and the efficiency of a power amplifier and also improve the ruggedness of a HBT.

The present invention provides a heterojunction bipolar transistor capable of improving the ruggedness without deteriorating the distortion characteristics and the efficiency of a power amplifier.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
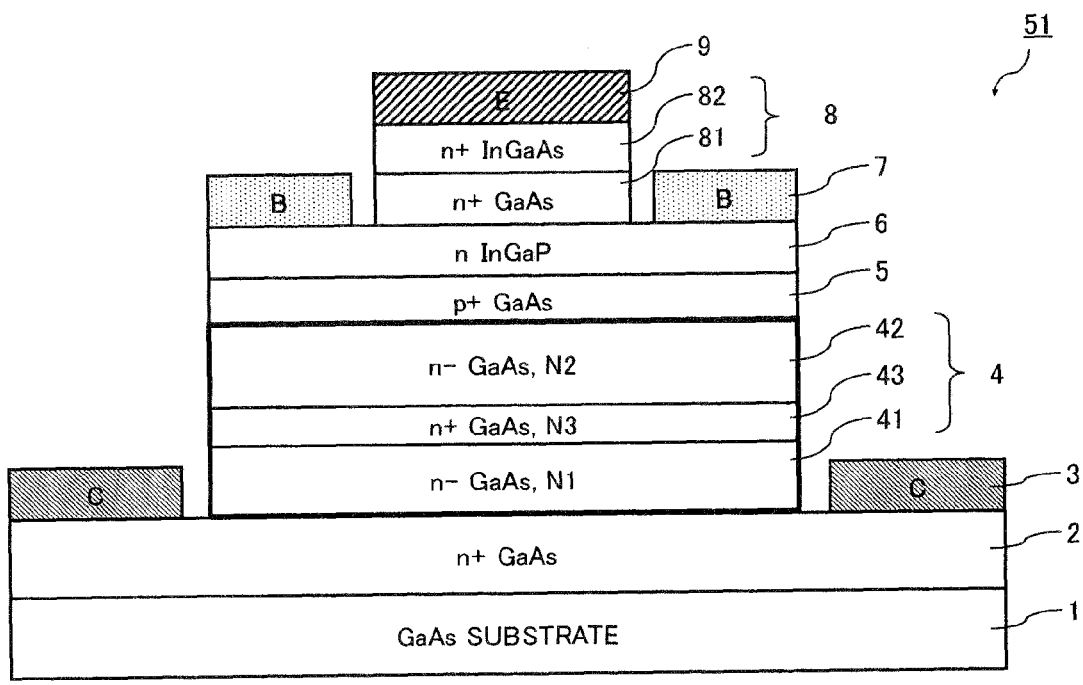
FIG. 1 is a sectional view showing a layer structure of a heterojunction bipolar transistor according to a first embodiment of the present invention.

A heterojunction bipolar transistor (HBT) according to a first embodiment of the present invention is described hereinafter with reference to the drawings. FIG. 1 is a sectional view showing a layer structure of a heterojunction bipolar transistor 51 according to the first embodiment of the present invention.

Referring to FIG. 1, an n+ type GaAs subcollector layer 2 is formed on a semi-insulating GaAs substrate 1. An impurity, such as silicon (Si), is doped into the n+ type GaAs subcollector layer 2 with a concentration of $1 \times 10^{18}$ cm$^{-3}$ or higher. A collector layer 4 is formed on the subcollector layer 2. The collector layer 4 is made of GaAs with an impurity concentration of lower than $1 \times 10^{18}$ cm$^{-3}$. The detail of the collector layer 4 is described later. A part of the surface of the subcollector 2 is exposed without being covered by the collector 4, and a collector electrode 3 is formed on the exposed part. The collector electrode 3 is in ohmic contact with the subcollector layer 2.

A p+ type GaAs base layer 5 is formed on the collector layer 4. An n type InGaP emitter layer 6 that is made of a semiconductor material having a wider bandgap than the base layer 5 is formed on the base layer 5. An emitter cap layer 8 that is composed of a lamination of a lower n+ type GaAs emitter cap layer 81 and an upper n+ type InGaAs emitter cap layer 82 is formed on the emitter layer 6. An emitter electrode 9 is formed on the emitter cap layer 8. The emitter cap layer 81 may not be a single layer of n+ type GaAs but a combination layer of n+ type GaAs and n− type GaAs.

A part of the surface of the emitter layer 6 is exposed without being covered by the emitter cap layer 8, and a base electrode 7 is formed on the exposed part. The base electrode 7 is in ohmic contact with the base layer 5 through the emitter layer 6.

The structure of the collector layer 4 is described below. The collector layer 4 is made of GaAs with an impurity concentration of lower than $1 \times 10^{18}$ cm$^{-3}$. In this embodiment, the collector layer 4 includes three layers each having a different impurity concentration: a first collector layer 41, a second collector layer 42 and a third collector layer 43. The first collector layer 41 having an impurity concentration N1 is formed on the subcollector layer 2, and the third collector layer 43 having an impurity concentration N3 is formed on the first collector layer 41. Further, the second collector layer 42 having an impurity concentration N2 is formed on the third collector layer 43. The base layer is formed on the second collector layer 42.

In this embodiment, the impurity concentration of the collector layer 4 is set to N3>N1>N2. Specifically, in the collector layer 4, the impurity concentration of the second collector layer 42 is the lowest, and the impurity concentration of the third collector layer 43 is the highest.

Figure 2:
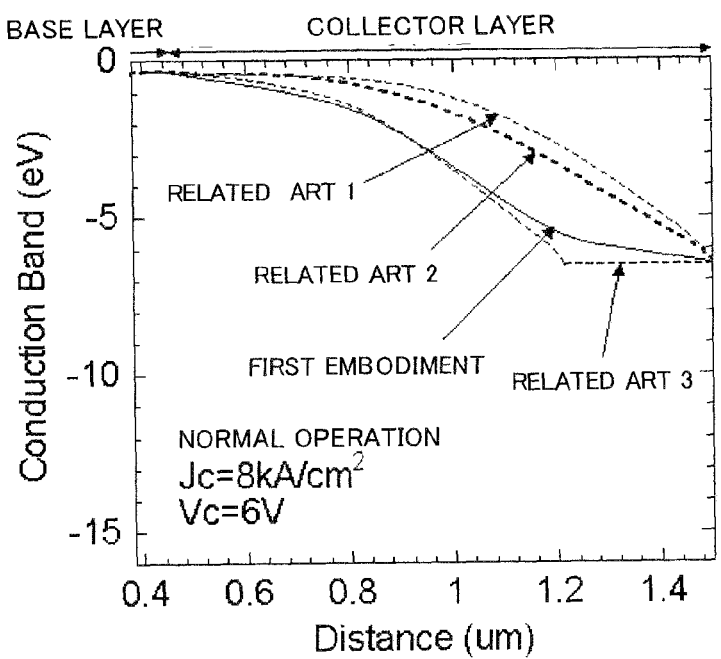
FIG. 2 is a graph showing a conduction band diagram in a collector layer and its proximity during normal operation.

The heterojunction bipolar transistor 51 of this embodiment has a layer structure of a plurality of semiconductor layers as described above. A conduction band diagram of the heterojunction bipolar transistor 51 is indicated by the solid line in FIG. 2. FIG. 2 is a graph showing a conduction band diagram in the collector layer 4 and its proximity during normal operation. Specifically, this embodiment uses n− type GaAs with a thickness of 200 nm and the impurity concentration N1 of $3\times10^{16}$ cm$^{-3}$ for the first collector layer 41. It uses n+ type GaAs with a thickness of 100 nm and the impurity concentration N3 of $5\times10^{16}$ cm$^{-3}$ for the third collector layer 43. Further, it uses n− type GaAs with a thickness of 700 nm and the impurity concentration N2 of $5\times10^{15}$ cm$^{-3}$ for the second collector layer 42.

Figure 19:
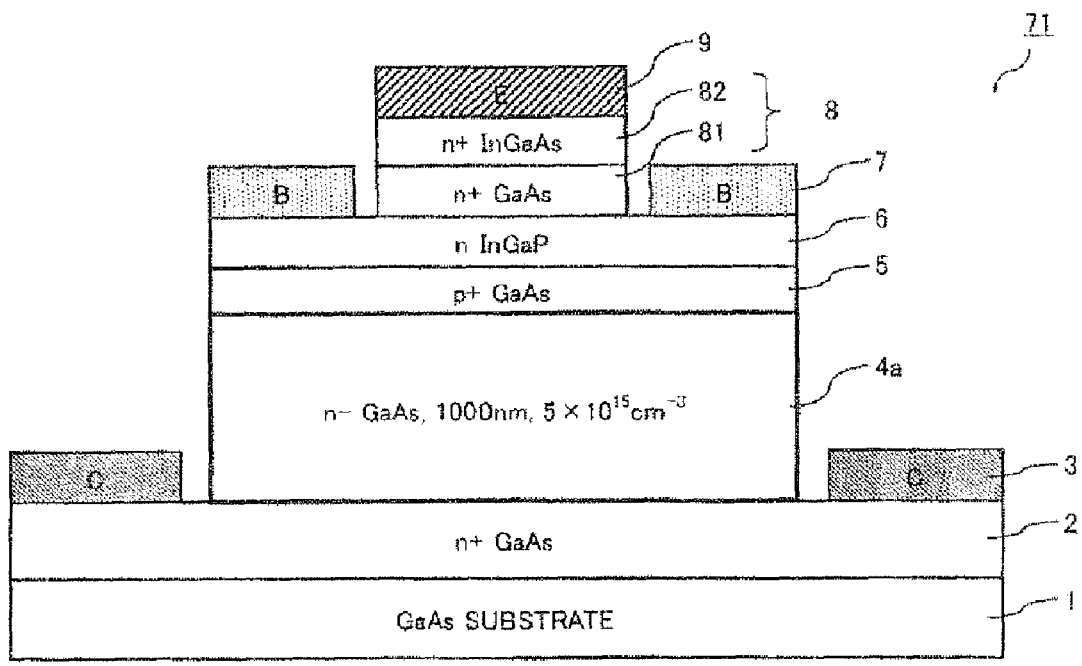
FIG. 19 is a sectional view showing a layer structure of a heterojunction bipolar transistor according to a related art 1.
Figure 20:
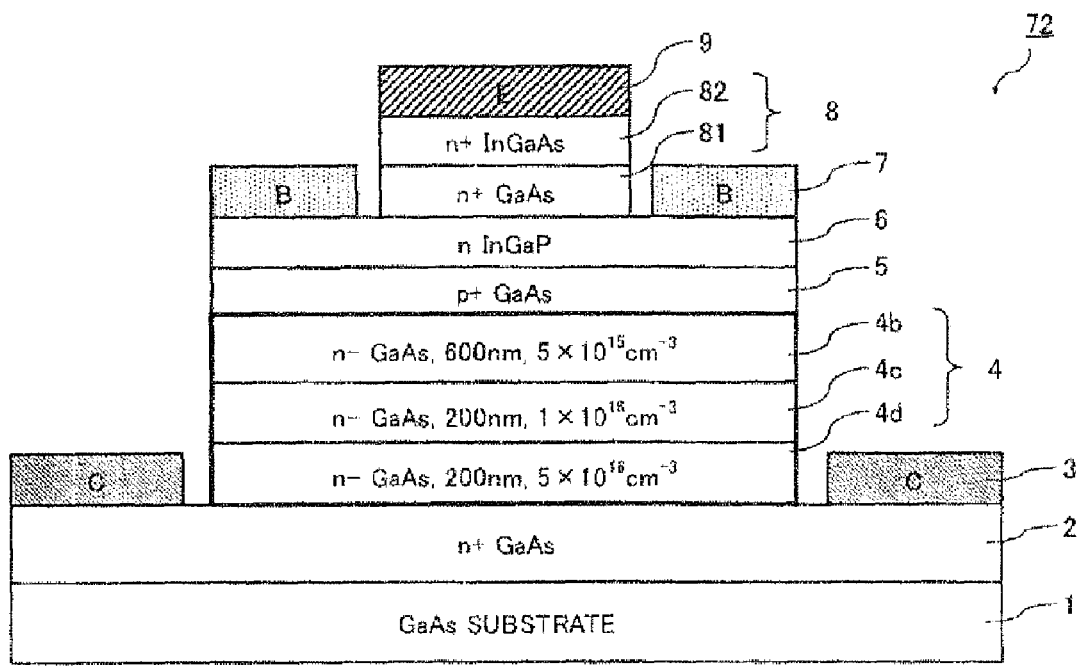
FIG. 20 is a sectional view showing a layer structure of a heterojunction bipolar transistor according to a related art 2.

In FIG. 2, conduction band diagrams according to the related arts are indicated by dotted lines for comparison. A heterojunction bipolar transistor 71 according to the related art 1 has the collector structure in which a collector layer thickness is large as shown in FIG. 19. Specifically, n− type GaAs with a thickness of 1000 nm and an impurity concentration of $5\times10^{15}$ cm$^{-3}$ is used for a collector layer 4a. A heterojunction bipolar transistor 72 according to the related art 2 has the collector structure in which a doping concentration increases gradually from the base layer 5 side to the subcollector layer 2 side as taught by Pan. With the collector layer thickness and the impurity concentration that are described in the embodiment taught by Pan, an on-state breakdown voltage with a collector current density Jc of 0 to 20 kA/cm$^2$, which is an operating current region of a power amplifier for mobile phones, is reduced (cf. a comparison between "standard" and "collector 1" in FIG. 5 of Pan). FIG. 20 shows the heterojunction bipolar transistor 72 that partly adjusts the collector layer thickness and the impurity concentration in such a way that an on-state breakdown voltage becomes high with an operating current density. Specifically, n− type GaAs with a thickness of 600 nm and an impurity concentration of $5\times10^{15}$ cm$^{-3}$ is used for a first collector layer 4b. Further, n− type GaAs with a thickness of 200 nm and an impurity concentration of $1\times10^{16}$ cm$^{-3}$ is used for a second collector layer 4c, and n− type GaAs with a thickness of 200 nm and an impurity concentration of $5\times10^{16}$ cm$^{-3}$ is used for a third collector layer 4d.

As shown in FIG. 2, a depletion layer extends to the interface with the subcollector layer 2 in the related arts 1 and 2. Because the concentration is higher on the side of the subcollector layer 2 in the collector structure of the related art 2 compared with the collector structure of the related art 1, the slope of the conduction band is slower on the subcollector side in FIG. 2, so that an electrical field is reduced. In this embodiment, because the doping concentration N3 of the third collector layer 43 is high, the position of the conduction band of the third collector layer 43 and the first collector layer 41 are low under the conditions of normal operation.

Figure 3:
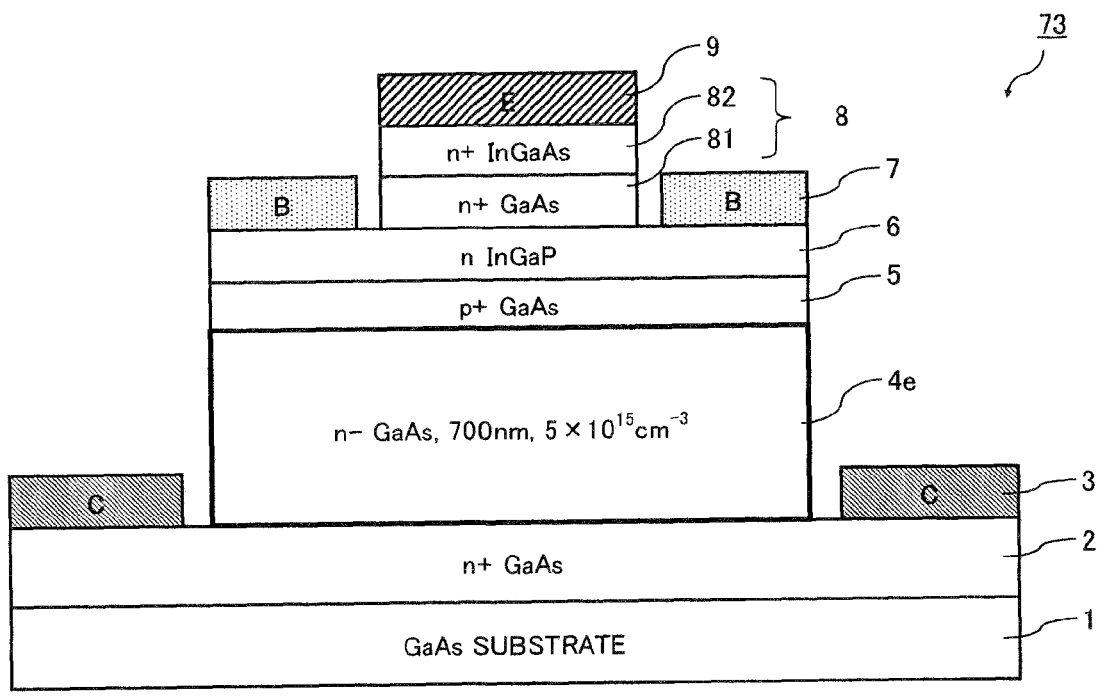
FIG. 3 is a sectional view showing a layer structure of a heterojunction bipolar transistor according to a related art 3.

FIG. 3 shows a collector structure according to a related art 3. A heterojunction bipolar transistor 73 according to the related art 3 uses n− type GaAs with a thickness of 700 nm and an impurity concentration of $5\times10^{15}$ cm$^{-3}$ for a collector layer 4e. Thus, the collector structure of the related art 3 has a collector layer only corresponding to the second collector layer 42 of this embodiment.

As obvious from FIG. 2, the conduction band diagram of this embodiment is close to that of the related art 3. This indicates that a depletion layer in the collector layer 4 does not extend to the third collector layer 43 and the first collector layer 41 but remains substantially within the second collector layer 42 in this embodiment. Therefore, within the range of normal operation, the third collector layer 43 and the first collector layer 41 are not activated, and only the second collector layer 42 is activated. Because the collector layer 4 that actually operates is thus only a part of the collector layer 4, the substantial collector layer thickness is reduced.

As described above, this embodiment reduces the substantial thickness of the collector layer during normal operation, so that a depletion layer can expand within the substantial thin collector layer with a lower voltage. Consequently, a change in the width of the depletion layer due to the amplitude of a collector voltage decreases, thereby enabling the significant reduction of a change in base-collector capacitance. This suppresses AM/PM distortion and thus improves the distortion characteristics of a power amplifier.

Figure 4:
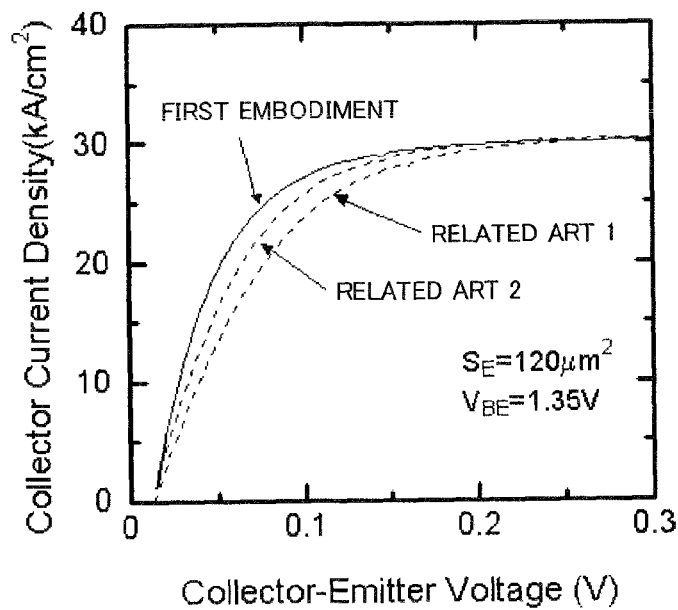
FIG. 4 is a graph showing current-voltage characteristics in gm mode.

FIG. 4 shows the current-voltage characteristics in gm mode. Generally, if the collector layer thickness increases as described in the related art 1, the electric field of the collector layer 4a in close proximity to the base layer 5 is reduced due to the Kirk effect. Consequently, the electrons that are injected from the base layer 5 to the collector layer 4a are not sufficiently accelerated, and thereby collector current decreases. As a result, the knee voltage in the current-voltage characteristics increases in the related art 1. In this embodiment, on the other hand, the substantial collector layer thickness is small during normal operation, and the electric field in the collector layer 4 becomes higher in close proximity to the base layer 5 as shown in FIG. 2. As a result, collector current increases in this embodiment, so that the knee voltage in the current-voltage characteristics is improved compared with the related arts 1 and 2 as shown in FIG. 4. This embodiment thereby improves the efficiency of a power amplifier.

Figure 5:
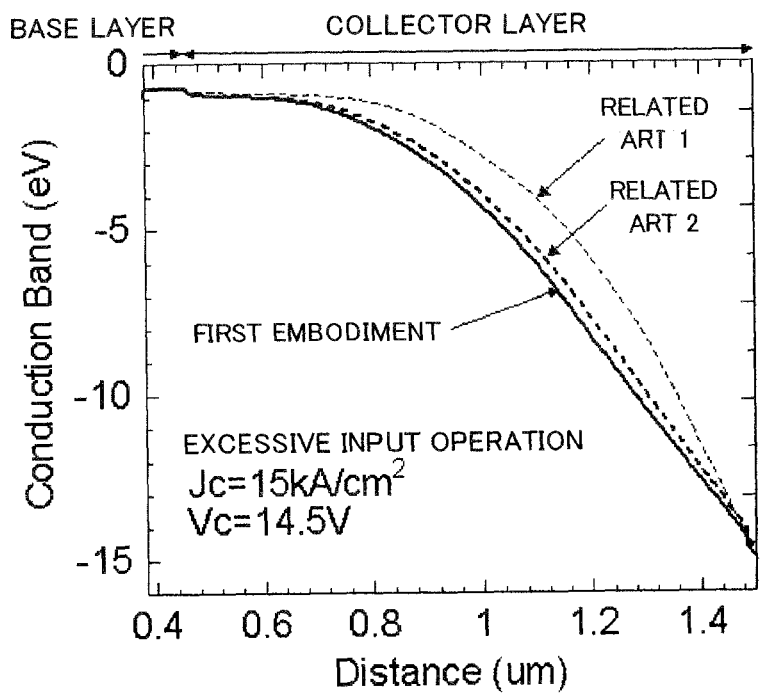
FIG. 5 is a graph showing a conduction band diagram in a collector layer and its proximity during excessive input operation.

FIG. 5 shows a conduction band diagram in the collector layer and its proximity during excessive input operation. If high current, high voltage is applied between a collector and an emitter, the potential of the conduction band of the third collector layer 43 increases in this embodiment. Consequently, a depletion layer in the collector layer 4 expands to the third collector layer 43 and the first collector layer 41. Therefore, in the excessive input state, the second collector layer 42, the third collector layer 43 and the first collector layer 41 are activated, so that the collector layer 4 that actually operates is the entire collector layer 4.

Figure 6:
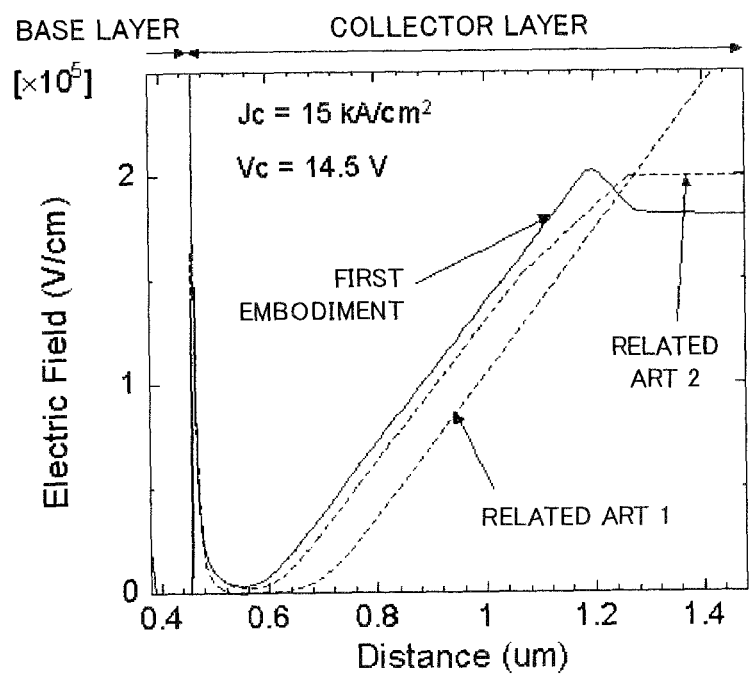
FIG. 6 is a graph showing an electric field distribution in a collector layer and its proximity during excessive input operation.

FIG. 6 is a graph showing an electric field distribution in the collector layer and its proximity during excessive input operation. In this embodiment, an electric field is suppressed midway because the doping concentration N3 of the third collector layer 43 is high. This embodiment thereby effectively reduces the area of the region where the electric field is highest unlike the related arts 1 and 2, as obvious from FIG. 6. An electron-hole pair generation rate that causes avalanche breakdown increases exponentially as an electric field becomes higher. Thus, the reduction of a high electric field region enables effective suppression of avalanche breakdown.

Figure 7:
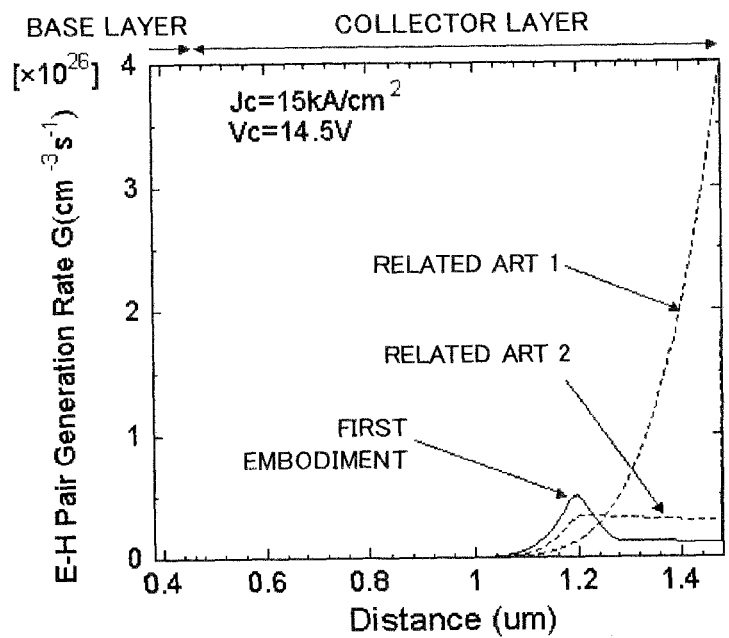
FIG. 7 is a graph showing an electron-hole pair generation rate in a collector layer and its proximity during excessive input operation.

FIG. 7 is a graph showing an electron-hole pair generation rate in the collector layer and its proximity during excessive input operation. In FIG. 7, the area of the graph indicating this embodiment is smaller than that of the related arts 1 and 2. If the integral of an electron-hole pair generation rate reaches 1, avalanche breakdown occurs. Thus, the heterojunction bipolar transistor 51 of this embodiment, with the small area indicated by the graph of FIG. 7, has a higher breakdown voltage.

Figure 8:
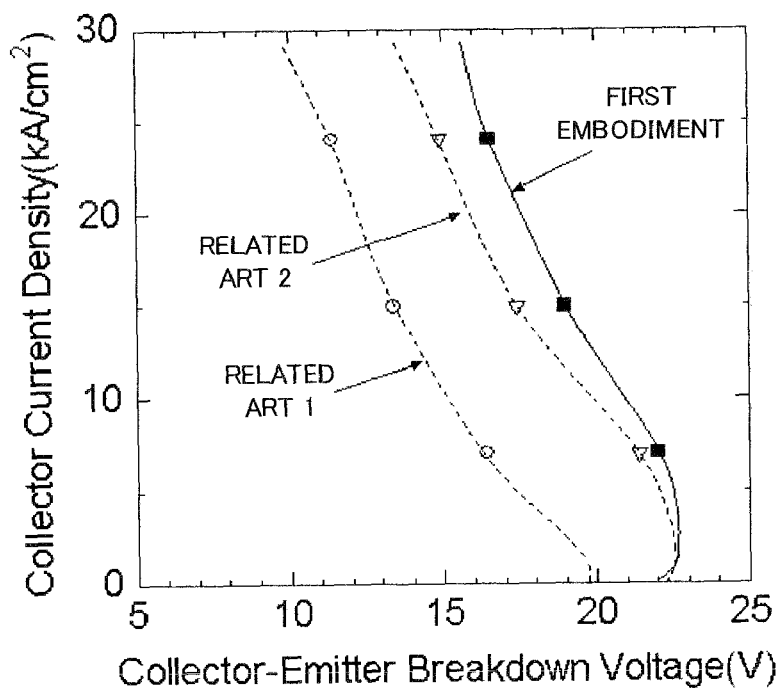
FIG. 8 is a graph showing an on-state breakdown voltage distribution during excessive input operation.

FIG. 8 is a graph showing an on-state breakdown voltage distribution during excessive input operation. As shown in FIG. 8, an on-state breakdown voltage of this embodiment is higher than that of the related arts 1 and 2 as a whole. As described above, because the doping concentration N3 of the third collector layer 43 is high in this embodiment, it is possible to reduce the electric field of the third collector layer 43 and the first collector layer 41, where an electric field is high. This suppresses the occurrence of avalanche breakdown, thus increasing an on-state breakdown voltage. The ruggedness is thereby improved.

A preferred impurity concentration and thickness of the collector layer 4 according to this embodiment are described hereinafter. In this embodiment, the impurity concentration of the collector layer 4 is set to: the third collector layer 43>the first collector layer 41>second collector layer 42. The first collector layer 41 is preferably n− type GaAs with a thickness of 50 to 600 nm and an impurity concentration of $1\times10^{16}$ to $1\times10^{18}$ cm$^{-3}$. The second collector layer 42 is preferably n− type GaAs with an impurity concentration of $1\times10^{15}$ to $5\times10^{16}$ cm$^{-3}$, or non-doped GaAs. Because the second collector layer 42 serves as a substantial collector during normal operation, its thickness is preferably 150 to 1000 nm and more preferably 400 nm to 1000 nm. The third collector layer 43 is preferably n+ type GaAs with a thickness of 25 to 400 nm and an impurity concentration of $1\times10^{16}$ to $2\times10^{17}$ cm$^{-3}$. If the doping concentration of the third collector layer 43 is too high, a depletion layer does not extend to the first collector layer 41 in the excessive input state. It is thus practically preferred that the third collector layer 43 has an impurity concentration of $1\times10^{17}$ cm$^{-3}$ or lower and a sheet concentration of $2\times10^{12}$ cm$^{-2}$ or lower. In order to prevent the third collector layer 43 from serving as a substantial collector, the thickness of the third collector layer 43 is smaller than that of the first collector layer 41 and the second collector layer 42.

As described above, this embodiment uses the collector layer 4 composed of three layers having different impurity concentrations that satisfy the third collector layer 43>the first collector layer 41>the second collector layer 42. A depletion layer thereby does not extend to the third collector layer 43 and the first collector layer 41 but remains substantially within the second collector layer 42 during normal operation. Thus, only the second collector layer 42 operates, so that a substantial collector layer thickness decreases. Consequently, a depletion layer can expand at a lower voltage during normal operation, which significantly reduces a change in collector capacitance. This suppresses AM/PM distortion and improves the distortion characteristics of a power amplifier. Further, because a substantial collector layer thickness is small, an electric field in the collector layer 4 is high. The leading edge characteristics in the current-voltage characteristics are thereby improved, and the efficiency of a power amplifier is improved accordingly. On the other hand, a depletion layer extends to the third collector layer 43 and the first collector layer 41 during excessive input operation. Thus, the entire collector layer 4 operates. An on-state breakdown voltage thereby increases and, as a result, the ruggedness resistance is improved.

Second Embodiment

Figure 9:
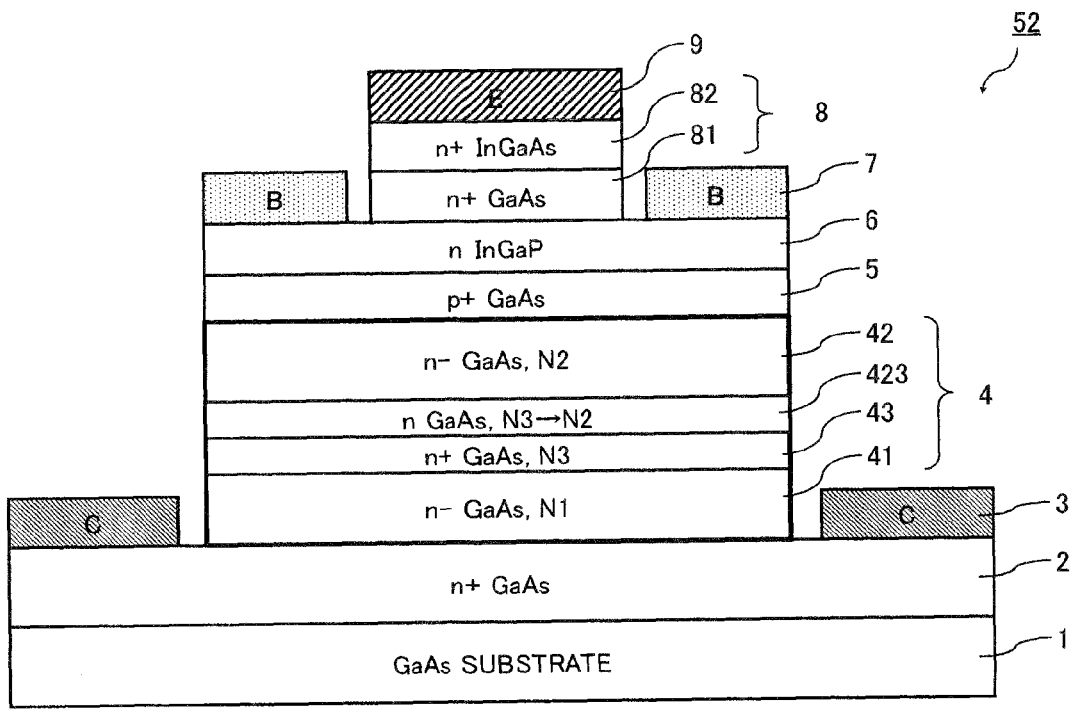
FIG. 9 is a sectional view showing a layer structure of a heterojunction bipolar transistor according to a second embodiment of the present invention.

A heterojunction bipolar transistor 52 according to a second embodiment of the present invention is described hereinafter with reference to FIG. 9. The structure of this embodiment is the same as that of the first embodiment except that it has a different collector layer 4, and the description of the same structure is not repeated herein. FIG. 9 is a sectional view showing a layer structure of the heterojunction bipolar transistor 52 according to the second embodiment. In FIG. 9, the same elements as in FIG. 1 are denoted by the same reference numerals and not described in detail herein.

Referring to FIG. 9, a first doping slope layer 423 is formed between the third collector layer 43 and the second collector layer 42. The first doping slope layer 423 is made of n type GaAs with an impurity concentration gradually changing from the impurity concentration N3 of the third collector layer 43 to the impurity concentration N2 of the second collector layer 42. Thus, the first doping slope layer 423 has the impurity concentration N3 at the interface with the third collector layer 43 and has the impurity concentration N2 at the interface with the second collector layer 42. The impurity concentration distribution of the first doping slope layer 423 is such that an impurity concentration is inclined from N3 to N2 along the thickness direction. The thickness of the first doping slope layer 423 is preferably about 10 to 200 nm.

As described above, the first doping slope layer 423 is formed between the third collector layer 43 and the second collector layer 42 in this embodiment. An electric field thereby changes slowly, which further increases an on-state breakdown voltage. As a result, the ruggedness is further improved.

Third Embodiment

Figure 10:
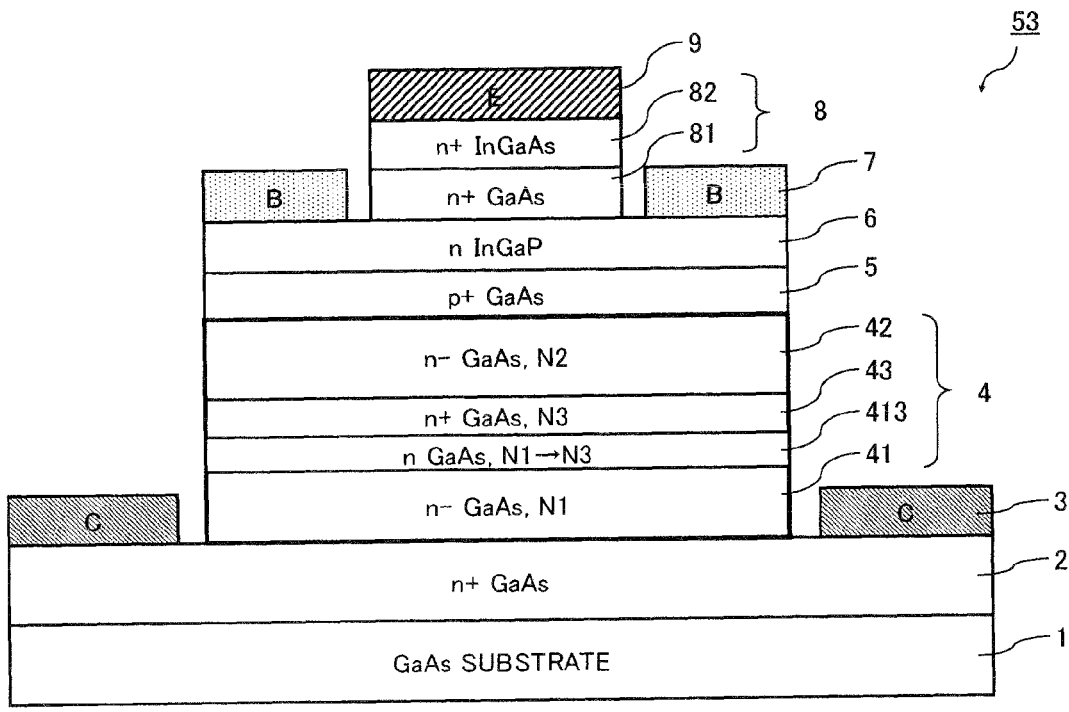
FIG. 10 is a sectional view showing a layer structure of a heterojunction bipolar transistor according to a third embodiment of the present invention.

A heterojunction bipolar transistor 53 according to a third embodiment of the present invention is described hereinafter with reference to FIG. 10. The structure of this embodiment is the same as that of the first and second embodiments except that it has a different collector layer 4, and the description of the same structure is not repeated herein. FIG. 10 is a sectional view showing a layer structure of the heterojunction bipolar transistor 53 according to the third embodiment. In FIG. 10, the same elements as in FIG. 1 are denoted by the same reference numerals and not described in detail herein.

Referring to FIG. 10, a second doping slope layer 413 is formed between the first collector layer 41 and the third collector layer 43. The second doping slope layer 413 is made of n type GaAs with an impurity concentration gradually changing from the impurity concentration N1 of the first collector layer 41 to the impurity concentration N3 of the third collector layer 43. Thus, the second doping slope layer 413 has the impurity concentration N1 at the interface with the first collector layer 41 and has the impurity concentration N3 at the interface with the third collector layer 43. The impurity concentration distribution of the second doping slope layer 413 is such that an impurity concentration is inclined from N1 to N3 along the thickness direction. The thickness of the second doping slope layer 413 is preferably about 10 to 200 nm. The first doping slope layer 423 is not formed in this embodiment.

As described above, the second doping slope layer 413 is formed between the first collector layer 41 and the third collector layer 43 in this embodiment. An electric field thereby changes slowly, which further increases an on-state breakdown voltage. As a result, the ruggedness is further improved.

Fourth Embodiment

Figure 11:
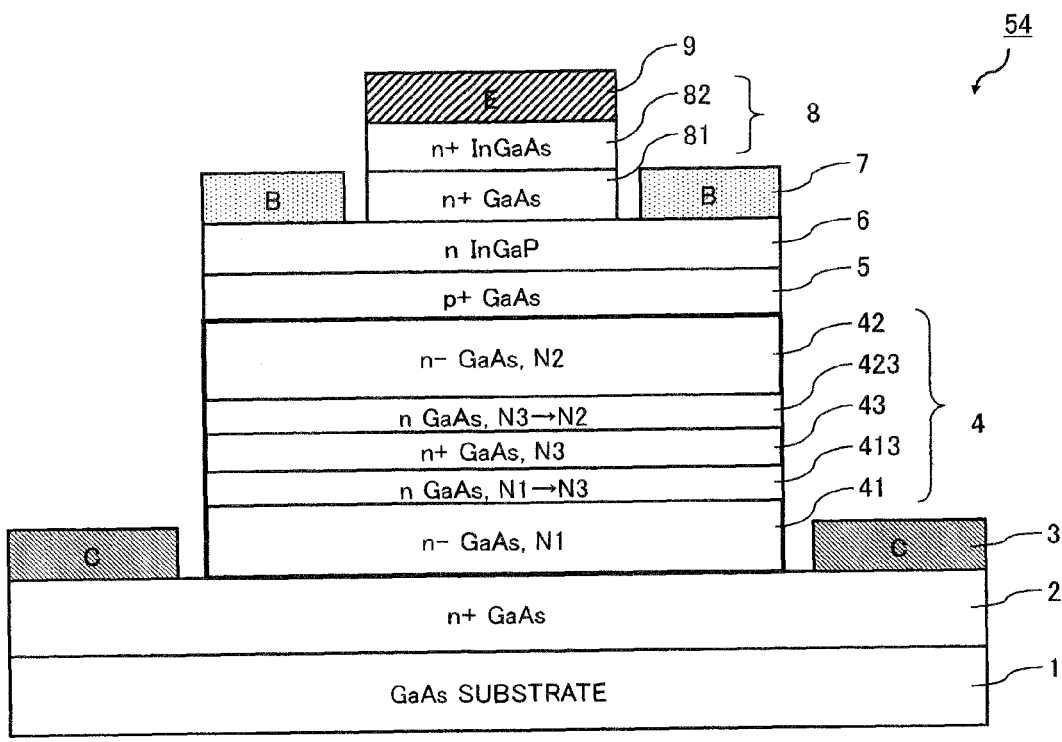
FIG. 11 is a sectional view showing a layer structure of a heterojunction bipolar transistor according to a fourth embodiment of the present invention.

A heterojunction bipolar transistor 54 according to a fourth embodiment of the present invention is described hereinafter with reference to FIG. 11. The structure of this embodiment is the same as that of the first to third embodiments except that it has a different collector layer 4, and the description of the same structure is not repeated herein. FIG. 11 is a sectional view showing a layer structure of the heterojunction bipolar transistor 54 according to the fourth embodiment. In FIG. 11, the same elements as in FIGS. 1, 9 and 10 are denoted by the same reference numerals and not described in detail herein.

Referring to FIG. 11, the first doping slope layer 423 is formed between the third collector layer 43 and the second collector layer 42. Further, the second doping slope layer 413 is formed between the first collector layer 41 and the third collector layer 43. Thus, the collector layer 4 of this embodiment includes both the first doping slope layer 423 and the second doping slope layer 413.

As described above, this embodiment includes both the first doping slope layer 423 and the second doping slope layer 413, thereby reducing the concentration gradient at the interface of each layer. This structure enables a further increase in an on-state breakdown voltage, thereby further improving the ruggedness of the transistor.

Fifth Embodiment

Figure 12:
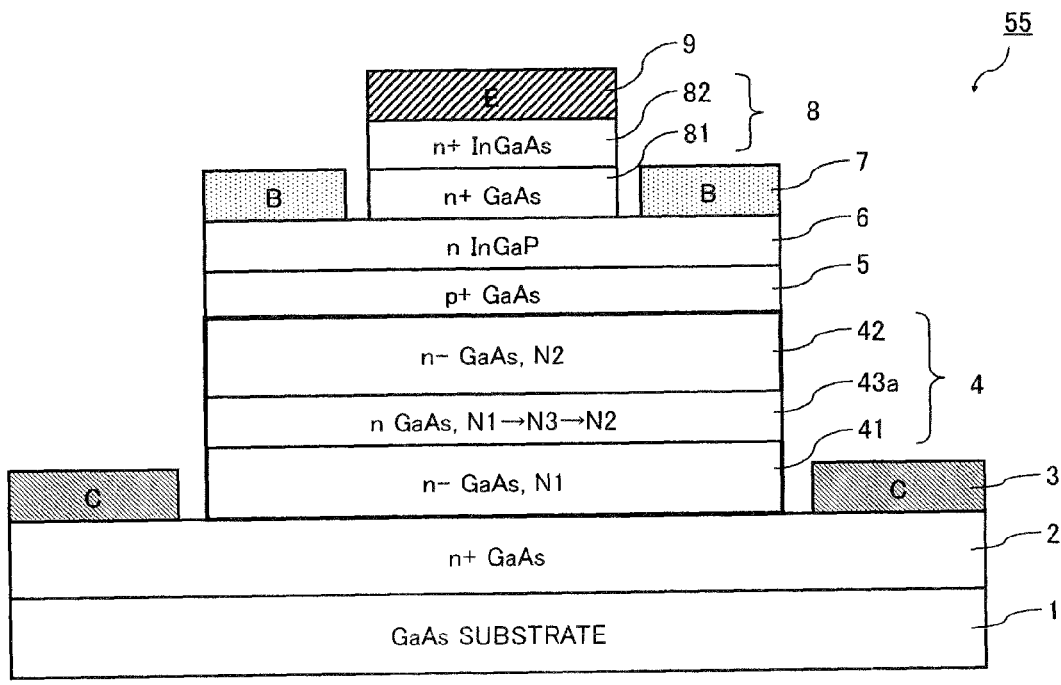
FIG. 12 is a sectional view showing a layer structure of a heterojunction bipolar transistor according to a fifth embodiment of the present invention.

A heterojunction bipolar transistor 55 according to a fifth embodiment of the present invention is described hereinafter with reference to FIG. 12. The structure of this embodiment is the same as that of the first to fourth embodiments except that it has a different collector layer 4, and the description of the same structure is not repeated herein. FIG. 12 is a sectional view showing a layer structure of the heterojunction bipolar transistor 55 according to the fifth embodiment. In FIG. 12, the same elements as in FIG. 1 are denoted by the same reference numerals and not described in detail herein.

Figure 13:
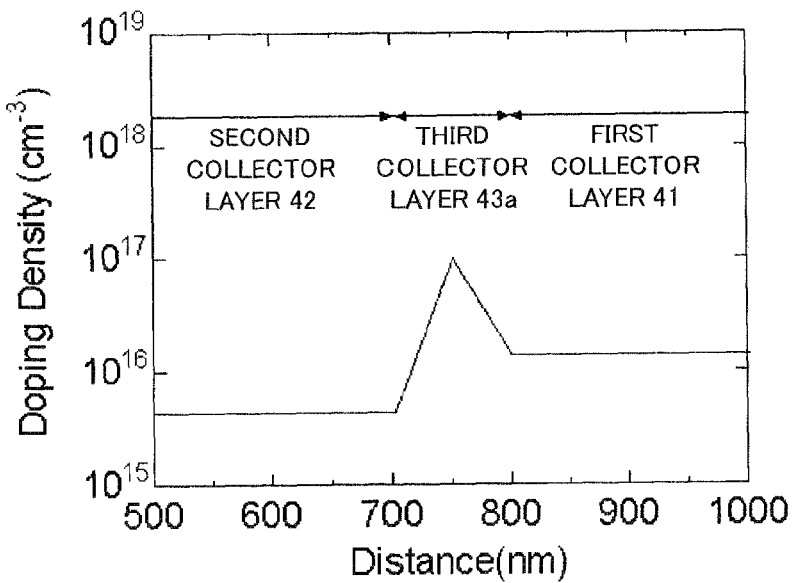
FIG. 13 is a graph showing a doping profile in a third collector layer and its proximity.

Referring to FIG. 12, a third collector layer 43a is formed between the first collector layer 41 and the second collector layer 42. Thus, the collector layer 4 of this embodiment includes the first collector layer 41, the third collector layer 43a and the second collector layer 42. The third collector layer 43a has a different impurity concentration distribution from the third collector layer 43, and an impurity is introduced with a prescribed distribution as shown in FIG. 13 along the thickness direction. Specifically, the third collector layer 43a has a maximum concentration point in substantially the middle of the layer in the thickness direction, and it has the impurity concentration N1 at the interface with the first collector layer 41 and the impurity concentration N2 at the interface with the second collector layer 42. The third collector layer 43a is made of n+ type GaAs with an impurity concentration that continuously changes from N1 through the maximum concentration point to N2 in the thickness direction. The impurity concentration at the maximum concentration point preferably corresponds to the impurity concentration N3 of the third collector layer 43 in the first embodiment. Specifically, the impurity concentration at the maximum concentration point is preferably about $1\times10^{16}$ to $2\times10^{18}$ cm$^{-3}$. The thickness of the third collector layer 43a is preferably about 10 to 200 nm.

As described above, the third collector layer 43a which has the impurity concentration that is continuously inclined from the maximum concentration point to the impurity concentration N1 of the first collector layer 41 and to the impurity concentration N2 of the second collector layer 42 is formed between the first collector layer 41 and the second collector layer 42 in this embodiment. A region where the impurity concentration is highest is thereby reduced, thus further suppressing avalanche breakdown. This structure enables a further increase in an on-state breakdown voltage, thereby further improving the ruggedness of the transistor.

Sixth Embodiment

Figure 14:
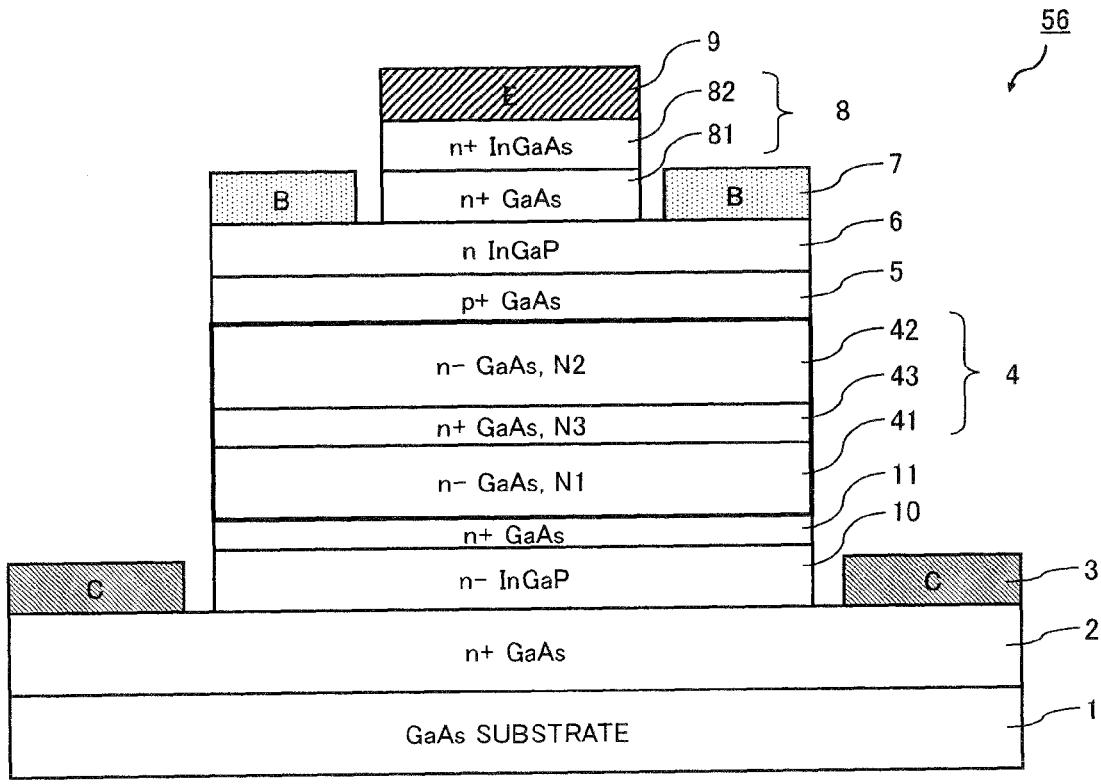
FIG. 14 is a sectional view showing a layer structure of a heterojunction bipolar transistor according to a sixth embodiment of the present invention.

A heterojunction bipolar transistor 56 according to a sixth embodiment of the present invention is described hereinafter with reference to FIG. 14. The structure of this embodiment is the same as that of the first embodiment except that it includes different layers, and the description of the same structure is not repeated herein. FIG. 14 is a sectional view showing a layer structure of the heterojunction bipolar transistor 56 according to the sixth embodiment. In FIG. 14, the same elements as in FIG. 1 are denoted by the same reference numerals and not described in detail herein.

Referring to FIG. 14, a high bandgap layer 10 and a high doped layer 11 are formed between the subcollector layer 2 and the collector layer 4. The other structure is the same as that of the first embodiment. Thus, the collector layer 4 includes the first collector layer 41, the third collector layer 43 and the second collector layer 42 as in the first embodiment. The high bandgap layer 10 (fourth collector layer), which is formed on the subcollector layer 2, is made of a semiconductor material with a wider bandgap than the first collector layer 41, which is n– type InGaP, for example. Specifically, the high bandgap layer 10 is preferably ordered InGaP (a composition ratio of In $X_{In}$=0.45 to 0.5, and a bandgap Eg=1.82 to 1.87 eV) in which natural superlattice is formed. Further, the high doped layer 11 is formed on the high bandgap layer 10. The collector layer 4 is formed on the high doped layer 11. The high doped layer 11 is preferably n+ type GaAs or ordered InGaP with a thickness of 5 to 10 nm and an impurity concentration of $5\times10^{17}$ to $3\times10^{18}$ cm$^{-3}$.

As described above, the high bandgap layer 10 and the high doped layer 11 are formed between the subcollector layer 2 and the collector layer 4 in this embodiment. In this structure, a hole barrier is newly formed between the high bandgap layer 10 and the high doped layer 11. If the generation of electron-hole pairs begins upon occurrence of a high electric field, holes are not diffused to the subcollector layer 2 side because of the hold barrier, so that the probability of existence of holes within the first collector layer 41 increases. Because the impurity concentration of the first collector layer 41 is lower than the impurity concentration of the third collector layer 43, the amount of space charges within the first collector layer 41 is subject to a hole concentration. Accordingly, the conduction band of the first collector layer 41 goes up according to the hole concentration, so that an electric field is concentrated on the high bandgap layer 10. The high bandgap layer 10 has a small ionization collision coefficient because of its high bandgap, and therefore avalanche breakdown is not likely to occur in spite of the electric field concentration. A new mechanism is introduced in this way by the combination of the high bandgap layer 10 with the first collector layer 41 and the third collector layer 43, thus improving the ruggedness of the transistor.

Seventh Embodiment

Figure 15:
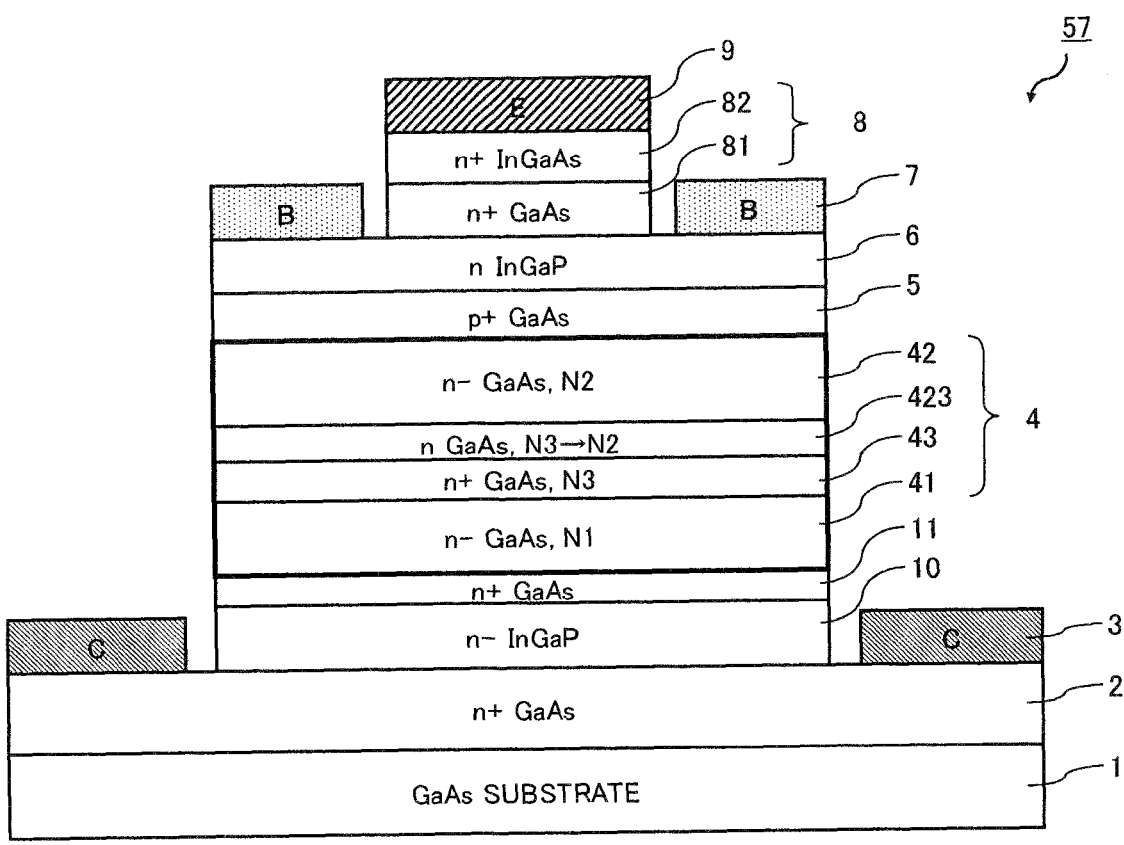
FIG. 15 is a sectional view showing a layer structure of a heterojunction bipolar transistor according to a seventh embodiment of the present invention.

A heterojunction bipolar transistor 57 according to a seventh embodiment of the present invention is described hereinafter with reference to FIG. 15. The structure of this embodiment is the same as that of the sixth embodiment except that it has a different collector layer 4, and the description of the same structure is not repeated herein. FIG. 15 is a sectional view showing a layer structure of the heterojunction bipolar transistor 57 according to the seventh embodiment. In FIG. 15, the same elements as in FIGS. 9 and 14 are denoted by the same reference numerals and not described in detail herein.

Referring to FIG. 15, the first doping slope layer 423 is formed between the third collector layer 43 and the second collector layer 42. The first doping slope layer 423 is made of n type GaAs with an impurity concentration gradually changing from the impurity concentration N3 of the third collector layer 43 to the impurity concentration N2 of the second collector layer 42 as described in the second embodiment. The thickness of the first doping slope layer 423 is preferably about 10 to 200 nm as in the second embodiment.

As described above, the first doping slope layer 423 is formed between the third collector layer 43 and the second collector layer 42 in this embodiment. An electric field thereby changes slowly, which further increases an on-state breakdown voltage. Further, the high bandgap layer 10 and the high doped layer 11 are placed between the subcollector layer 2 and the collector layer 4, which increases an on-state breakdown voltage more effectively by the effect that is described in the sixth embodiment.

Eighth Embodiment

Figure 16:
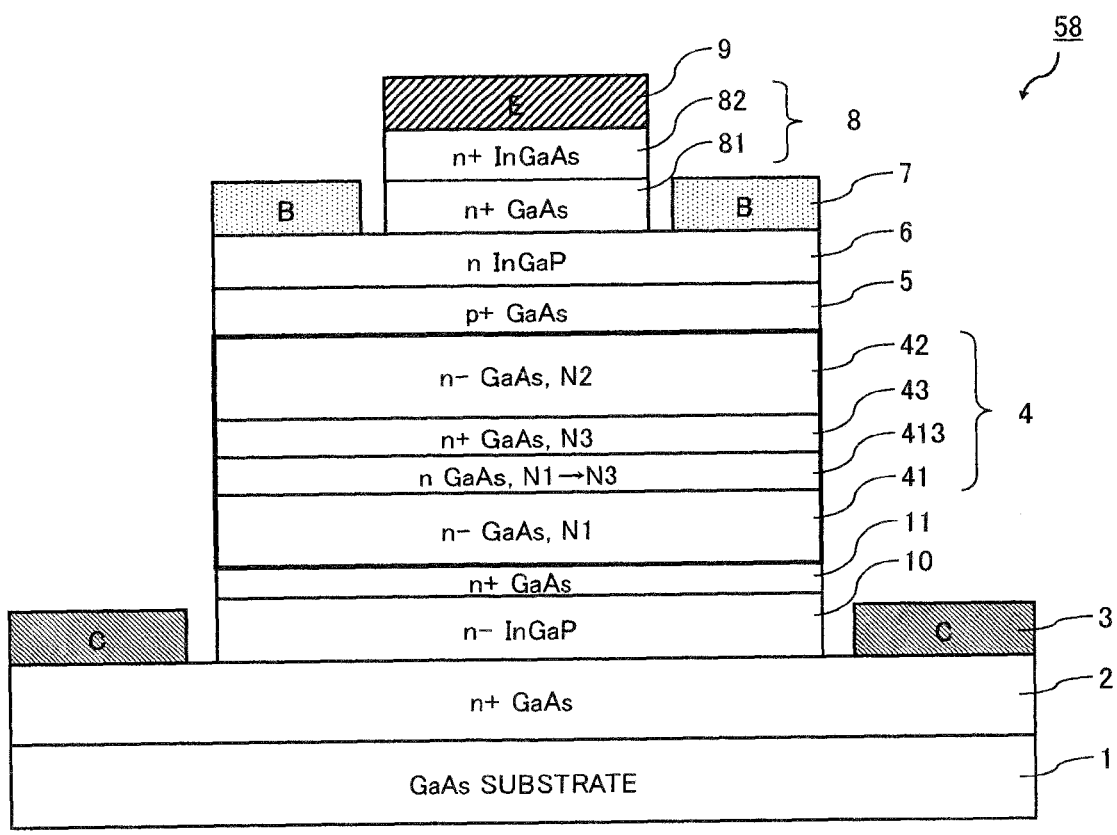
FIG. 16 is a sectional view showing a layer structure of a heterojunction bipolar transistor according to an eighth embodiment of the present invention.

A heterojunction bipolar transistor 58 according to an eighth embodiment of the present invention is described hereinafter with reference to FIG. 16. The structure of this embodiment is the same as that of the sixth and seventh embodiments except that it has a different collector layer 4, and the description of the same structure is not repeated herein. FIG. 16 is a sectional view showing a layer structure of the heterojunction bipolar transistor 58 according to the eighth embodiment. In FIG. 16, the same elements as in FIGS. 10 and 14 are denoted by the same reference numerals and not described in detail herein.

Referring to FIG. 16, the second doping slope layer 413 is formed between the first collector layer 41 and the third collector layer 43 in this embodiment. The second doping slope layer 413 is made of n type GaAs with an impurity concentration gradually changing from the impurity concentration N1 of the first collector layer 41 to the impurity concentration N3 of the third collector layer 43 as described in the third embodiment. The thickness of the second doping slope layer 413 is preferably about 10 to 200 nm as in the third embodiment. The first doping slope layer 423 is not formed in this embodiment.

As described above, the second doping slope layer 413 is formed between the first collector layer 41 and the third collector layer 43 in this embodiment. An electric field thereby changes slowly, which further increases an on-state breakdown voltage. Further, the high bandgap layer 10 and the high doped layer 11 are placed between the subcollector layer 2 and the collector layer 4, which increases an on-state breakdown voltage more effectively by the effect that is described in the sixth embodiment.

Ninth Embodiment

Figure 17:
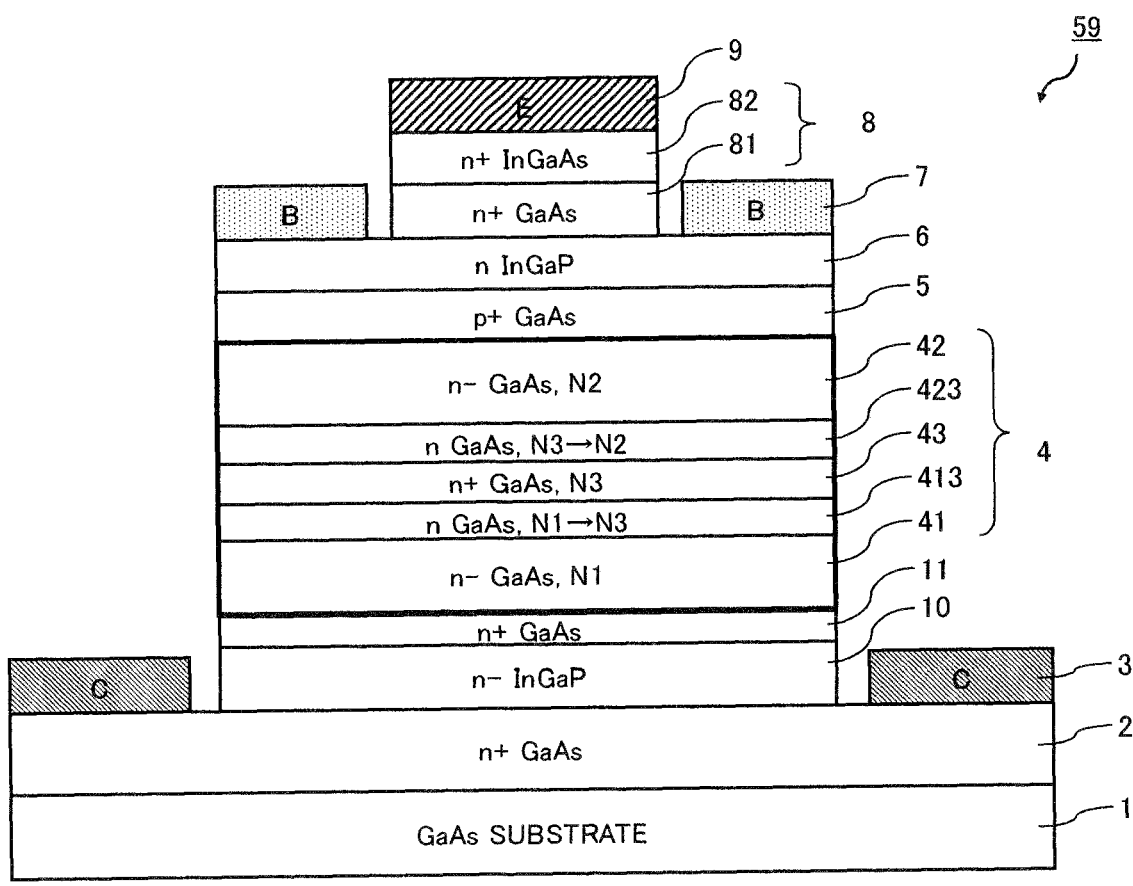
FIG. 17 is a sectional view showing a layer structure of a heterojunction bipolar transistor according to a ninth embodiment of the present invention.

A heterojunction bipolar transistor 59 according to a ninth embodiment of the present invention is described hereinafter with reference to FIG. 17. The structure of this embodiment is the same as that of the sixth to eighth embodiments except that it has a different collector layer 4, and the description of the same structure is not repeated herein. FIG. 17 is a sectional view showing a layer structure of the heterojunction bipolar transistor 59 according to the ninth embodiment. In FIG. 17, the same elements as in FIGS. 11 and 14 are denoted by the same reference numerals and not described in detail herein.

Referring to FIG. 17, the first doping slope layer 423 is formed between the third collector layer 43 and the second collector layer 42. Further, the second doping slope layer 413 is formed between the first collector layer 41 and the third collector layer 43. Thus, the collector layer 4 of this embodiment includes both the first doping slope layer 423 and the second doping slope layer 413 as in the fourth embodiment.

As described above, this embodiment includes both the first doping slope layer 423 and the second doping slope layer 413, thereby reducing the concentration gradient at the interface of each layer. This structure enables a further increase in an on-state breakdown voltage. Further, the high bandgap layer 10 and the high doped layer 11 are placed between the subcollector layer 2 and the collector layer 4, which increases an on-state breakdown voltage more effectively by the effect that is described in the sixth embodiment.

Tenth Embodiment

Figure 18:
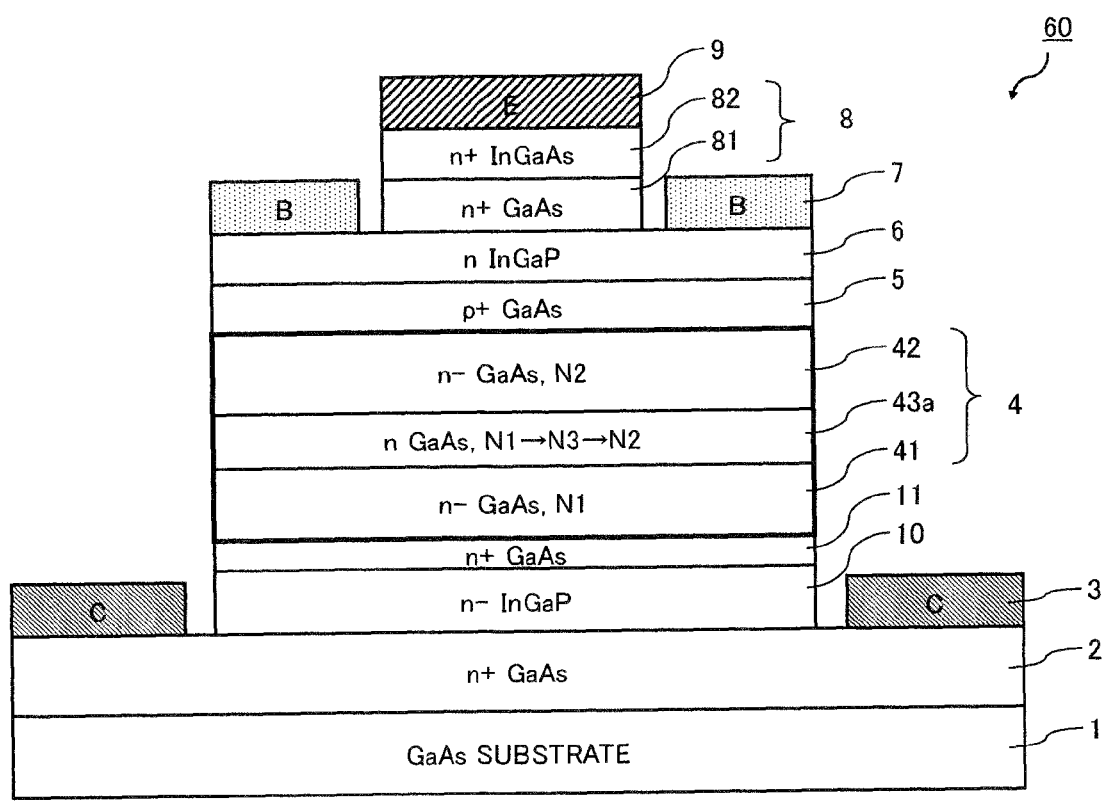
FIG. 18 is a sectional view showing a layer structure of a heterojunction bipolar transistor according to a tenth embodiment of the present invention.

A heterojunction bipolar transistor 60 according to a tenth embodiment of the present invention is described hereinafter with reference to FIG. 18. The structure of this embodiment is the same as that of the sixth to ninth embodiments except that it has a different collector layer 4, and the description of the same structure is not repeated herein. FIG. 18 is a sectional view showing a layer structure of the heterojunction bipolar transistor 60 according to the tenth embodiment. In FIG. 18, the same elements as in FIGS. 12 and 14 are denoted by the same reference numerals and not described in detail herein.

Referring to FIG. 18, the third collector layer 43a is formed between the first collector layer 41 and the second collector layer 42. An impurity is introduced to the third collector layer 43a with a prescribed distribution as shown in FIG. 13 along the thickness direction as described in the fifth embodiment. Specifically, the third collector layer 43a has an impurity concentration distribution where a maximum concentration point exists in substantially the middle of the layer in the thickness direction and an impurity concentration is continuously inclined from the maximum concentration point to the impurity concentration N1 of the first collector layer 41 and to the impurity concentration N2 of the second collector layer 42. The impurity concentration at the maximum concentration point is preferably about $1 \times 10^{16}$ to $2 \times 10^{18}$ cm$^{-3}$. The thickness of the third collector layer 43a is preferably about 10 to 200 nm.

As described above, the third collector layer 43a which has the impurity concentration that is continuously inclined from the maximum concentration point to the impurity concentration N1 of the first collector layer 41 and to the impurity concentration N2 of the second collector layer 42 is formed between the first collector layer 41 and the second collector layer 42 in this embodiment. A region where the impurity concentration is highest is thereby reduced, thus further increasing an on-state breakdown voltage. Further, the high bandgap layer 10 and the high doped layer 11 are placed between the subcollector layer 2 and the collector layer 4, which increases an on-state breakdown voltage more effectively by the effect that is described in the sixth embodiment.

Although the emitter layer 6 is made of n type InGaP in the above-described embodiments, it is not limited thereto, and a given semiconductor that is different from InGaP may be used as long as it is a material with a wider bandgap than the base layer 5. Likewise, the high bandgap layer 10 is not limited to n− type InGaP, and a given semiconductor that is different from InGaP may be used as long as it is a material with a wider bandgap than the first collector layer 41.

Although preferred embodiments of the present invention are described in the foregoing, the present invention is not limited to the above-described embodiments. A person skilled in the art will be able to easily change, add, or modify various elements of the above-described embodiments without departing from the scope and spirit of the present invention.

It is apparent that the present invention is not limited to the above embodiment and it may be modified and changed without departing from the scope and spirit of the invention.

What is claimed is:

1. A heterojunction bipolar transistor, comprising:
   a subcollector layer of a first conductivity type;
   a first collector layer formed on the subcollector layer, the first collector layer containing an impurity of the first conductivity type;
   a third collector layer formed on the first collector layer, the third collector layer containing an impurity of the first conductivity type at a higher concentration than the first collector layer;
   a second collector layer formed on the third collector layer, the second collector layer containing an impurity of the first conductivity type at a lower concentration than the first collector layer;
   a base layer of a second conductivity type formed on the second collector layer;
   an emitter layer of the first conductivity type formed on the base layer, the emitter layer containing a semiconductor with a wider bandgap than the base layer; and
   an emitter cap layer of the first conductivity type formed on the emitter layer,
   wherein the first collector layer, the second collector layer and the third collector layer are made of the same semiconductor material.

2. The heterojunction bipolar transistor according to claim 1, wherein a thickness of the third collector layer is smaller than a thickness of the first collector layer and the second collector layer.

3. The heterojunction bipolar transistor according to claim 2, wherein a thickness of the second collector layer is 150 nm or larger.

4. The heterojunction bipolar transistor according to claim 3, wherein an impurity concentration of the second collector layer is $5 \times 10^{16}$ cm$^{-3}$ or lower.

5. The heterojunction bipolar transistor according to claim 4, wherein an impurity concentration of the third collector layer is $1 \times 10^{17}$ cm$^{-3}$ or lower.

6. The heterojunction bipolar transistor according to claim 4, wherein an impurity sheet concentration of the third collector layer is $2 \times 10^{12}$ cm$^{-2}$ or lower.

7. The heterojunction bipolar transistor according to claim 1, further comprising:
   a first doping slope layer formed between the second collector layer and the third collector layer, the first doping slope layer having an impurity concentration distribution with an impurity concentration gradually increasing from an impurity concentration of the second collector layer to an impurity concentration of the third collector layer in a thickness direction.

8. The heterojunction bipolar transistor according to claim 1, further comprising:
   a second doping slope layer formed between the first collector layer and the third collector layer, the second doping slope layer having an impurity concentration distribution with an impurity concentration gradually increasing from an impurity concentration of the first collector layer to an impurity concentration of the third collector layer in a thickness direction.

9. The heterojunction bipolar transistor according to claim 1, wherein the third collector layer has an impurity concentration distribution with a maximum concentration point of the impurity of the first conductivity type existing in the third collector layer and with an impurity concentration gradually increasing from an impurity concentration of the first collector layer to the maximum concentration point and gradually decreasing from the maximum concentration point to an impurity concentration of the second collector layer.

10. The heterojunction bipolar transistor according to claim 9, wherein an impurity concentration at the maximum concentration point is $1 \times 10^{15}$ cm$^{-3}$ or higher and lower than $2 \times 10^{18}$ cm$^{-3}$.

11. The heterojunction bipolar transistor according to claim 4, further comprising:
    a high bandgap layer formed between the subcollector layer and the first collector layer, the high bandgap layer containing a semiconductor with a wider bandgap than the first collector layer.

12. The heterojunction bipolar transistor according to claim 11, wherein the high bandgap layer is made of InGaP with a composition ratio of In of 0.45 or higher and lower than 0.50.

13. The heterojunction bipolar transistor according to claim 12, wherein InGaP as a material of the high bandgap layer is InGaP grown under a condition favoring formation of natural superlattice or InGaP grown to create a bandgap of 1.82 to 1.87 Ev.

14. The heterojunction bipolar transistor according to claim 11, further comprising:
    a high doped layer formed between the high bandgap layer and the first collector layer, the high doped layer containing an impurity of the first conductivity type at $5 \times 10^{17}$ cm$^{-3}$ or higher and lower than $3 \times 10^{18}$ cm$^{-3}$.

15. The heterojunction bipolar transistor according to claim 14, wherein the high doped layer is made of GaAs or the same semiconductor material as the high bandgap layer.

* * * * *